United States Patent [19]
Nishi

[11] Patent Number: 5,440,138
[45] Date of Patent: Aug. 8, 1995

[54] EXPOSURE METHOD

[75] Inventor: Kenji Nishi, Yokohama, Japan

[73] Assignee: Nikon Corporation, Tokyo, Japan

[21] Appl. No.: 178,527

[22] Filed: Jan. 5, 1994

[30] Foreign Application Priority Data

Jan. 6, 1993 [JP] Japan .................................. 5-000583

[51] Int. Cl.⁶ .......................................... G01N 21/86
[52] U.S. Cl. .................................... 250/548; 356/401
[58] Field of Search ........................ 250/548, 557, 561;
356/399–401; 355/53, 54, 77; 219/121.68

[56] References Cited

U.S. PATENT DOCUMENTS

| | | | |
|---|---|---|---|
| 4,444,492 | 4/1984 | Lee | 356/401 |
| 4,669,866 | 6/1987 | Phillips | 356/401 |
| 4,982,227 | 1/1991 | Suzuki | 355/54 |
| 5,004,348 | 4/1991 | Magome | 356/401 |
| 5,140,366 | 8/1992 | Shiozawa et al. | 355/53 |
| 5,148,214 | 9/1992 | Ohta et al. | 355/43 |
| 5,204,535 | 4/1993 | Mizutani | 250/548 |
| 5,249,016 | 9/1993 | Tanaka | 355/53 |
| 5,262,822 | 11/1993 | Kosugi et al. | 355/53 |

*Primary Examiner*—Stephone B. Allen
*Attorney, Agent, or Firm*—Shapiro and Shapiro

[57] ABSTRACT

A plurality of reticles have each two alignment mark images and an identical or a different pattern image. First, the two alignment mark images and the pattern image of the first reticle are exposed on a first shot area on a wafer. Next, when exposing the two alignment mark images and the pattern image of the second reticle on a second shot area adjacent to the first shot area, the exposed two alignment mark images on the first shot area are detected to adjust the wafer and the second reticle based on the result of the detection such that the exposed pattern images on the first and second shot areas are joined correctly. Thus, the pattern images of the left reticles are also exposed successively with the exposed adjacent pattern images joined. Preferably, after each detection, the detected two alignment mark images are deleted by the double exposure.

5 Claims, 7 Drawing Sheets

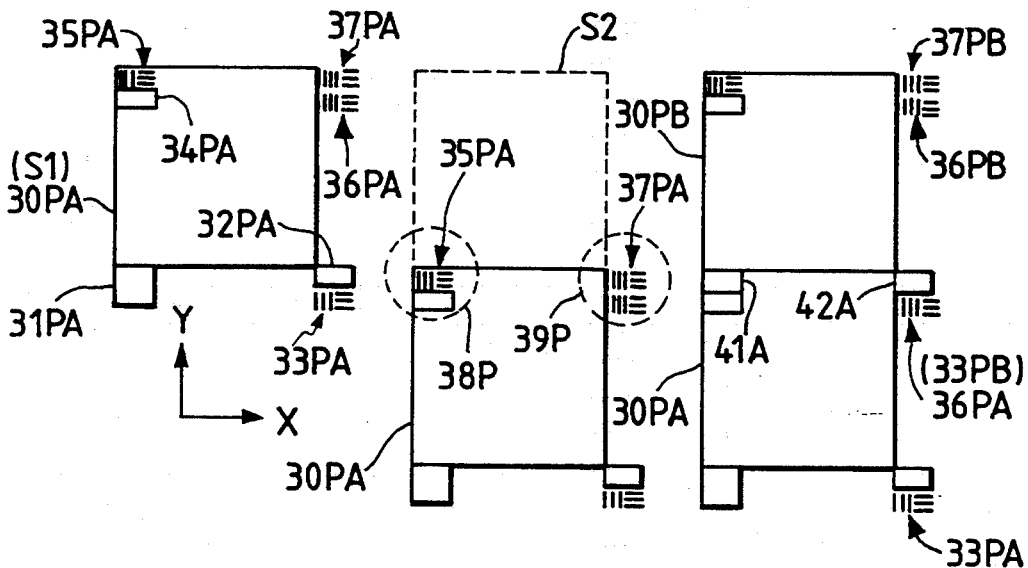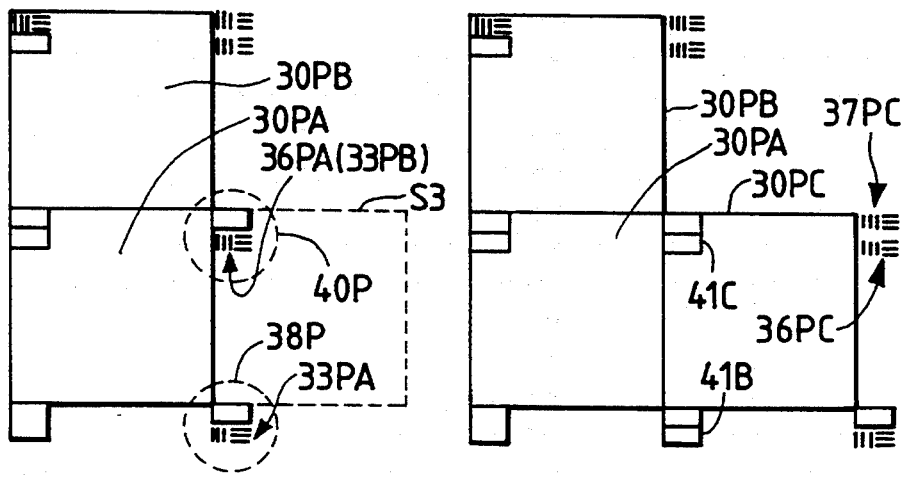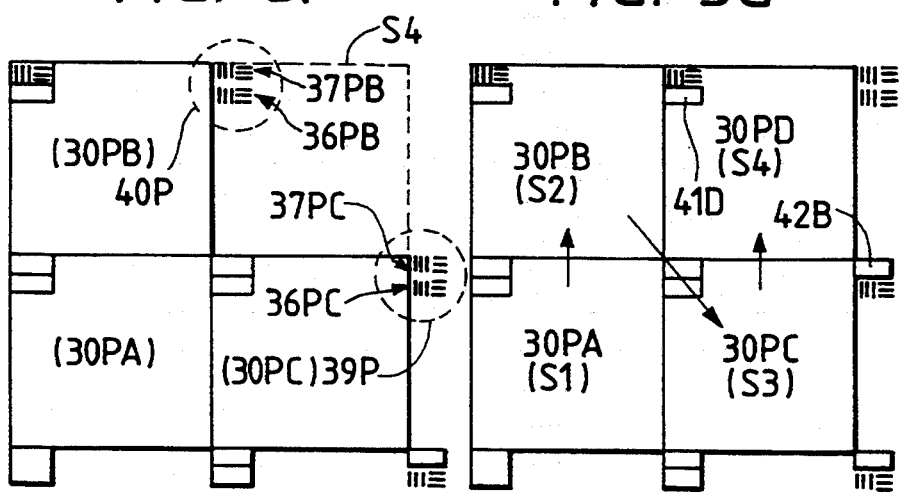

EXPOSURE METHOD

BACKGROUND OF THE INVENTION

1. Field of the Invention

The present invention relates to a method of exposing a pattern image of a reticle or pattern images of a plurality of reticles on a photosensitive substrate by joining them successively.

2. Related Background Art

In manufacturing semiconductor devices, liquid crystal display devices, thin film magnetic heads or the like under a photolithography process, there us used a projecting optical apparatus (stepper, aligner and the like) which projects an image of a pattern on a photomask or a reticle (hereinafter simply called the reticle) onto a photosensitive substrate via a projection optical system. In the projecting optical apparatus, the maximum exposure field of the projection optical system has a circular exposure area, as shown in FIG. 8A. Accordingly, the size of a chip pattern to be exposed on the photosensitive substrate at a time is equal to that of a rectangular shot area 2 inscribed in the maximum exposure field 1.

Therefore, when exposing a chip pattern larger than the shot area 2 on the photosensitive substrate, it is necessary to expose a pattern formed on a reticle repeatedly or patterns formed on a plurality of reticles on the photosensitive substrate such that adjacent pattern images on the substrate are joined so as to be integrated.

In FIG. 8B showing a conventional exposure procedure in such a joining method, a pattern of a first reticle is first exposed on a first shot area S1 on a wafer coated with a photosensitive material as a photosensitive substrate. Then, after a wafer stage with the wafer disposed thereon is driven to position a second shot area S2 adjacent to the first shot area S1 in an exposure field of a projection optical system, the pattern of the first reticle or a pattern of a second reticle changed with the first reticle is exposed on the second shot area S2.

Thereafter, pattern of reticles are exposed on third, fourth, ... and ninth shot areas S3, S4, ... and S9 adjacent to the respective preceding shot areas successively by the step and repeat system. As a result, a chip pattern having a large area is exposed on the exposure area consisting of the shot areas S1 to S9 of 3 lines×3 rows on the wafer.

In the above-mentioned conventional method, a large chip pattern is exposed by joining the pattern images of a plurality of shot areas. Accordingly, it is necessary to maintain the overlapping accuracy (joining accuracy) of adjacent pattern images at joining portions between each shot area to a high degree. However, when performing an exposure on and after the second shot area, there is no other way to raise the overlapping accuracy than raising stepping and rotation accuracy.

Then, if the sufficient stepping and rotation accuracy cannot be obtained, the overlapping accuracy is deteriorated, so that there is a danger that a finished large chip does not operate normally.

FIG. 8C shows an enlarged diagram of a boundary area A of the shot areas S6 and S7 in FIG. 8B. A circuit pattern image 3 on the shot area S6 and a circuit pattern image 4 on the shot area S7 are overlapped by a width ΔL, and hatched portions are a joining potion 5. There occur, positioning errors Δx and Δy in two orthogonal directions between the shot areas S6 and S7 due to the relative stepping positioning and rotation errors of the shot area S7 relative to the shot area S6. When these positioning errors Δx and Δy exceed allowable values, the joining portion 5 becomes too narrow and the chip fails to operate properly.

In order to avoid the failure at the joining portion, it is conceivable to enlarge the area of the joining portion. However, in that case, it is impossible to form circuit patterns minutely.

SUMMARY OF THE INVENTION

It is an object of the present invention to provide to an exposure method capable of improving overlapping accuracy at joining portions between adjacent shot areas to improve the yield rate of a finally obtained large chip.

In order to achieve the above and other objects and advantages, e.g., as shown in FIGS. 1A to 1E, when exposing a pattern formed on a mask repeatedly or respective patterns formed on a plurality of masks successively on a photosensitive substrate with the adjacent pattern images joined to expose a larger pattern than each of the patterns, a first mask formed with a pattern and at least one mark for positioning (alignment mark) is first used. The pattern (16 PA) and the mark (21PA, 22PA) of the first mask are exposed on a first shot area (S1) on the photosensitive substrate. Then, the position of the exposed mark image (21PA, 22PA) is detected when exposing the pattern of the first mask or a pattern of a second mask different from that of the first mask on a second shot area (S2) adjacent to the first shot area (S1) so as to be joined on the exposed pattern image (16PA) of the first mask. Thereafter, the photosensitive substrate and the mask with the pattern to be exposed on the second shot area (S2) are adjusted positionally based on the result of the detection.

In a preferred embodiment of the present invention, a double exposure is performed on the exposed mark image (21PA, 22PA) so as to delete the exposed mark image (21PA, 22PA) when exposing the pattern of the first mask or the pattern of the second mask on the second shot area (S2).

In another preferred embodiment of the present invention, e.g., as shown in FIGS. 5A to 5G, at least three marks for positioning are formed on each of the masks as objects for exposure. When performing an exposure on a third shot area (S2 to S4) on the photosensitive substrate after the exposure of the first shot area (S1), there are detected at least one mark image selected from the three mark images exposed on a shot area or each of two shot areas adjacent to the third shot area (S2 to S4). Then, the photosensitive substrate and the mask having the pattern to be exposed on the third shot area are adjusted positionally based on the result of the detection.

According to the present invention, the position of the mark image for positioning (21PA, 22PA) of the latent image pattern exposed on the photosensitive substrate is detected and then the photosensitive substrate and the mask with the pattern to be exposed on the second shot area (S2) are aligned each other properly based on the result of the detection, so that it is possible to improve positioning accuracy at the joining portion between the first shot area (S1) and the second shot area (S2).

Also, when performing an exposure on the second shot area (S2), the mark image (21PA, 22PA) of the latent image pattern exposed on the first shot area (S1) is detected by the double exposure, so that no mark image is left on the photosensitive substrate. Therefore, after a large chip pattern is formed on the photosensitive substrate by development after the successive exposures in the joining method and when exposing again a large chip pattern image on the previous large chip pattern, it is possible to expose again a new mark image for positioning on the same portion where the previous mark image for positioning was exposed in the previous exposure process. Accordingly, when forming large chip patterns on the photosensitive substrate over a plurality of layers, the same portion can be used as a latent image pattern area for a mark image for positioning at the time of an exposure for each layer.

Further, as shown in FIGS. 5A to 5G, in exposing pattern of masks respectively in the joining method on a plurality of shot areas arranged in a matrix-like manner, the joining directions becomes two directions and it is not necessarily sufficient to provide one or two mark for positioning on each mask. Then, the at least three marks for positioning are formed on the masks as the objects for exposure. When performing the exposure on the third shot area (S2 to S4) on the photosensitive substrate after the exposure for the first shot area (S1), and if the third shot area is a shot area (S2) adjacent to the upper side of the first shot area (S1), the two mark images (35PA, 37PA) located in the vicinity of those boundary portion are used for alignment.

If the third shot area is a shot area (S3) adjacent to the right end portion of the first shot area (S1), the two mark images located in the vicinity of those boundary portion are used for alignment while if the third shot area is a shot area (S4) situated upwardly and obliquely to the first shot area (S1), e.g., the two mark images (36PB, 36PC) in the diagonal direction are used for alignment. Thereby, it is possible to improve overlapping accuracy at the respective joining portions between the shot area arranged in the matrix-like manner.

Furthermore, when forming at least three marks for positioning on each of the masks as the objects for exposure, the mark image (33PB) of the latent image pattern is formed by the exposure for the second shot area (S2) so as to overlap with the mark image (36PA) of the latent image pattern formed by the exposure for the first shot area (S1), e.g., as shown in FIG. 5C. Since thus composed latent image pattern indicates the mean position of the pattern images exposed on both the shot areas (S1, S2). Therefore, the improvement of the overlapping accuracy at the joining portions can be expected by carrying out alignment by use with the compositive latent image pattern to perform an exposure for the third shot area.

BRIEF DESCRIPTION OF THE DRAWINGS

The above and other objects and advantages of the present invention will become apparent from the following detailed description of the preferred embodiments when read in connection with the following drawings, in which:

FIGS. 5A to 5G are an explanatory diagram showing an exposure process according to the second embodiment;

DETAILED DESCRIPTION OF THE PREFERRED EMBODIMENTS

Referring now to FIGS. 1A to 1E, 2 and 3, an embodiment of exposure method of the present invention will be described.

Figure 2:
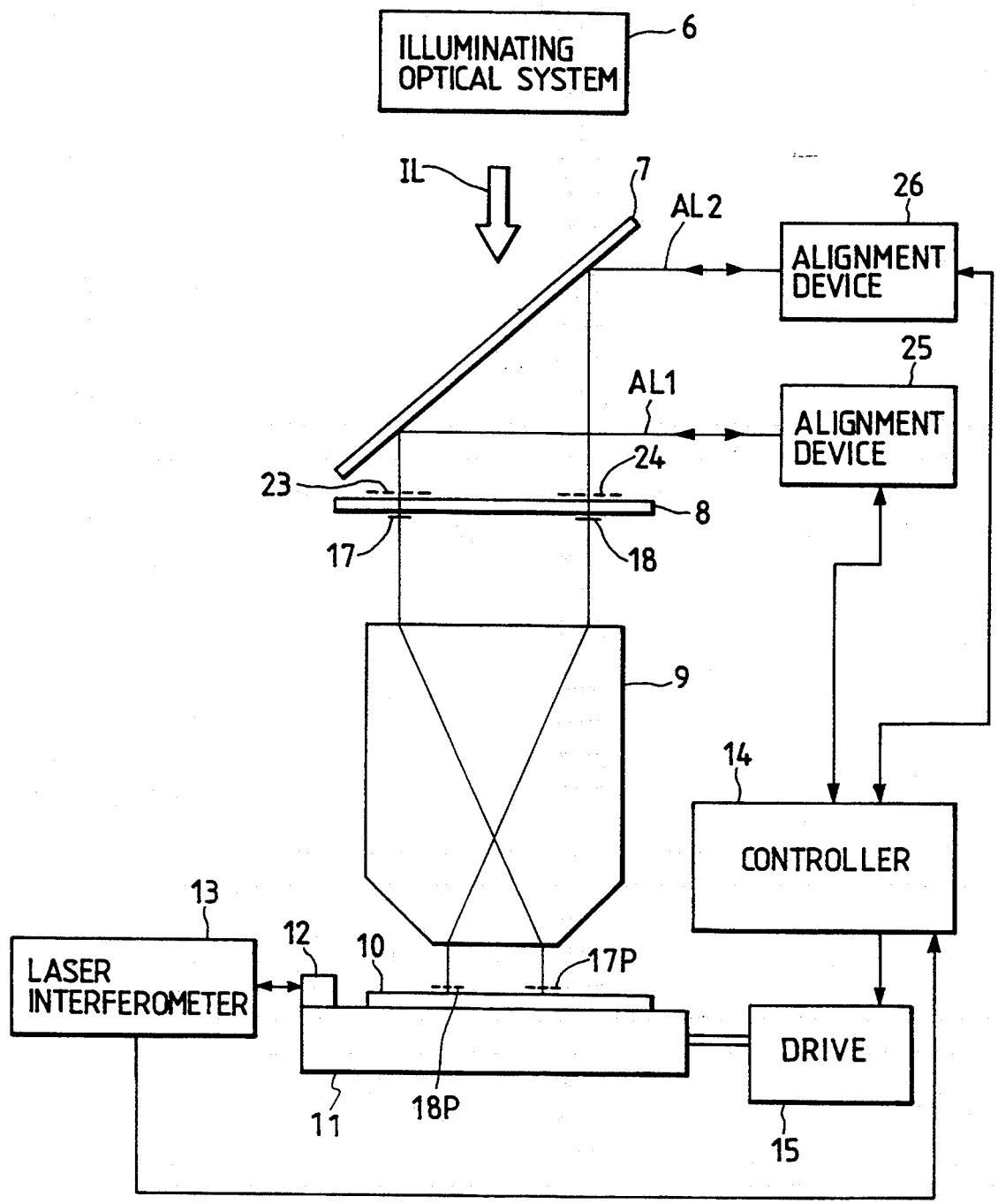
FIG. 2 is a block diagram showing a projection optical apparatus according to the embodiment.

In FIG. 2 showing a projection optical apparatus, an exposure light IL emitted from an illuminating optical system 6 passes through a dichroic mirror 7 and illuminates a pattern formed area of a reticle 8. The reticle 8 is held on a reticle stage (not shown) which is parallelly shiftable and slightly rotatable in a two-dimensional plane.

An image of a pattern of the reticle 8 is projected and formed on a wafer 10 coated with a photoresist via a projection optical system 9 under the exposure light IL. The wafer 10 is held on a wafer stage 11 which is constituted of a XY stage for positioning the wafer 10 within a two-dimentional plane perpendicular to an optical axis of the projection optical system 9, a Z stage for positioning the wafer 10 in a Z direction parallel to the optical axis of the projection on optical system 9 and a stage for rotating the wafer 10 slightly.

On the upper end of the wafer stage 11 is secured a movable mirror 12 by which laser beams from a laser interferometer 13 are reflected. A rectangular coordinate system in the two-dimensional plane perpendicular to the optical axis of the projection optical system 9 consists of a X-coordinate and a Y-coordinate, and the movable mirror 12 has a plane mirror perpendicular to the X-coordinate and a plane mirror perpendicular to the Y-coordinate. The later interferometer 13 is constituted of two interferometers for radiating laser beams to the movable mirror 12 along the X-coordinate and a laser interferometer for radiating a laser beam to the movable mirror 12 along the Y-coordinate. Accordingly, the X-coordinate and the Y-coordinate of the wafer stage 11 are measured by one of the laser interferometers for the X-coordinate and the laser interferometer for the Y-coordinate, and the rotation amount (displacement in a $\theta$ direction) of the wafer stage 11 is measured by the difference between the measured values of the two interferometers for the X-coordinate.

The measured X and Y-coordinates of the wafer stage 11 and the displacement in the $\theta$ direction are supplied to a controller 14 which then controls movement of the wafer stage 11 via a drive device 15.

Figure 3:
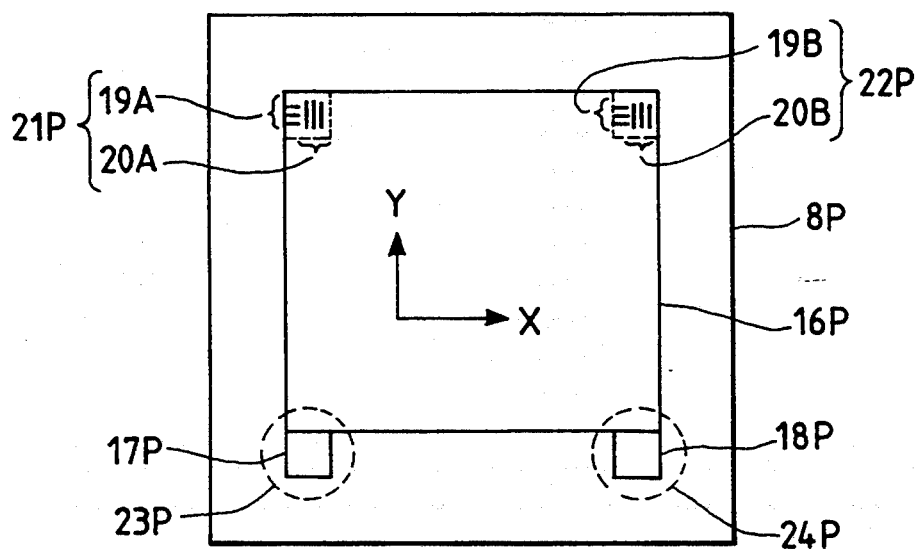
FIG. 3 is a plan view showing a projected image on a wafer from a reticle according to the embodiment.

In FIG. 3 showing a reticle image 8P formed by projecting the reticle 8 of the embodiment on the wafer 10, a rectangular circuit pattern image 16P is formed on an area corresponding to the pattern formed area of the reticle 8. Also, two opening portion images 17P and 18P are projected outside one side of the circuit pattern image 16 parallel to the X direction while two alignment mark images 21P and 22P are projected inside the other side of the circuit pattern image 16 parallel to the X direction. The alignment mark image 21P has a grating-like mark image 19A arranged in the Y direction at a constant pitch and a grating-like mark image 20A arranged in the X direction at a constant pitch. The alignment mark image 22P has mark images 19B and 20B which are the same as the respective mark images 19A and 20A. Namely, the alignment mark images 21P and 22P has such a shape that the positions of those in the X and Y directions can be detected.

Returning to FIG. 2, opening portions 17 and 18 with rectangular opening patterns are formed on areas of the reticle 8 corresponding to the opening portion images 17P and 18P on the wafer 10. Detection areas 23 and 24 are disposed so as to surround the opening portions 17 and 18. Detection lights are illuminated to the detection areas 23 and 24 for alignment. As shown in FIG. 3, detection areas 23P and 24P are corresponding areas in an exposure field of the projection optical system 9 to the detection areas 23 and 24. In FIG. 2, two alignment devices 25 and 26 are disposed on a side of the dichroic mirror 7. When aligning the reticle 8 with the wafer 10, the alignment devices 25 and 26 emit detection lights AL1 and AL2 which have a different wave band from the exposure light I1 and will not expose the photosensitive applied to the wafer 10.

However, it is possible to utilize detection lights having photosensitivity to the photoresist instead of the detection lights AL1 and AL2. In that case, the time when the detecting lights illuminate the wafer 10 should be as shorter as possible, so that the alignment mark images as latent patterns to be described later will not change.

The detecting light AL1 emitted from the alignment device 25 is reflected by the dichroic mirror 7 and directed to the opening portion 17 within the detection area 23 on the reticle 8. The detecting light AL1 passing through the opening portion 17 then illuminates a latent image of the alignment mark which has been exposed via the projection optical system 9 on the wafer 10 under the previous process. The diffracted or reflected detecting light AL1 from the latent image again returns to the alignment device 25 via the projecting optical system 9, the opening portion 17 of the reticle 8 and the dichroic mirror 7 to re-form the latent image of the alignment mark on the wafer 10 onto a light receiving surface of an image pickup element (CCD etc.) in the alignment device 25. Thereby, it is possible to detect the relative positional relationship between the opening portion 17 of the reticle 8 and the latent image of the alignment mark on the wafer 10 from the relationship between the re-formed image and an edge of the image of the opening portion 17 of the reticle 8.

Similarly, the detecting light AL2 emitted from the other alignment device 26 is reflected by the dichroic mirror 7, directed to the opening portion 18 within the detection area 24 on the reticle 8 and illuminated on the latent image of the other alignment mark on the wafer 10 via the projection optical system 9. The diffracted and reflected detecting light AL2 from the latent image is again returned to the alignment device 26 via the projection optical system 9, the opening portion 18 of the reticle 8 and the dichroic mirror 7. The alignment device 26 detects the relative positional relationship between the opening portion 18 of the reticle 8 and the latent image of the other alignment mark on the wafer 10 from the relationship between the re-formed latent image and an edge of the image of the opening portion 18 of the reticle 8.

The information of the positional relationship detected by the alignment devices 25 and 26 is sent to the controller 14, which makes the reticle 8 align with a shot area of the wafer 10 to be exposed on the basis of the information and exposure data. Thereafter, the pattern of the reticle 8 is exposed on the shot area of the wafer 10. The alignment devices 25 and 26 may be, for example, as disclosed in U.S. Pat. Nos. 5,204,535 or 5,004,348, a double luminous interfering type alignment apparatus which detects the latent image patterns on the wafer 10 by using a double luminous flux laser beam.

Hereinafter, it will be described an example of an operation for exposing a chip pattern having a large area by joining an image of a pattern of a reticle or images of pattern of a plurality of reticles on the wafer 10 according to this embodiment.

Figure 1A:
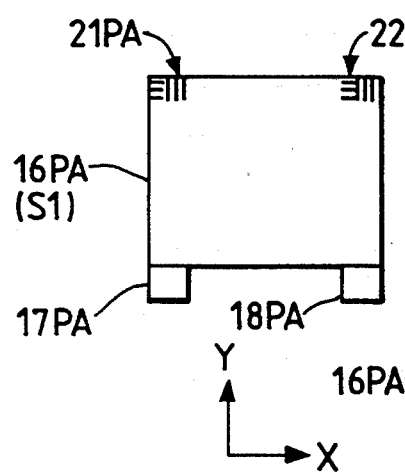
FIGS. 1A to 1E are an explanatory diagram showing an exposure process according to a first embodiment of the present invention.
Figure 1B:
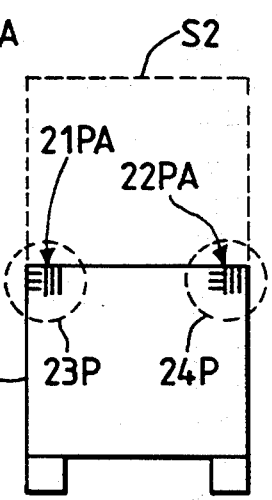

FIGS. 1A to 1E show the process of joining and exposing shot areas. As shown in FIG. 1A, a circuit pattern image 16PA of the reticle 8 in FIG. 2 is first exposed on a first shot area S1 of the wafer 10. At this time, opening portion images 17PA and 18PA, and alignment mark images 21PA and 22PA are simultaneously exposed. Then, after changing the reticle 8 in FIG. 2 with a reticle for the following exposure as required, a second shot area S2 on the wafer 10 is shifted in the Y direction and positioned in the exposure field of the projection optical system 9 in FIG. 2, as shown in FIG. 1B. This shift is performed based on a coordinate arrangement of each shot area under the design as conventional.

In this condition, detecting lights are emitted from the alignment devices 25 and 26 to the respective detection areas 23P and 24P on the wafer 10 thereby to detect the relative positional relationship between alignment mark images 21PA and 22PA consisting of latent images and opening portions of the reticle (corresponding to the opening portions 17 and 18 in FIG. 2) to be exposed. The obtained information of the relative positional relationship is sent to the controller 14, which then calculates the amount of the positional deviation between the circuit pattern image 16PA having been already exposed on the first shot area S1 and a circuit pattern image of the reticle to be exposed. Thereafter, the controller 14 drives the wafer stage 11 and/or the reticle stage (not shown) to correct the relative positional relationship between the reticle to be exposed and the wafer 10 such that the positional deviation is minimized.

Figure 1C:
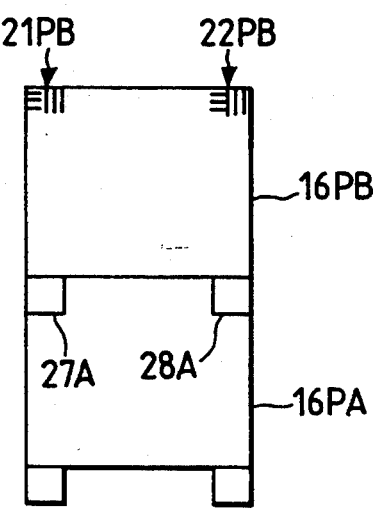

Then, a circuit pattern image 16PB of the reticle is exposed on the second shot area S2, as shown in FIG. 1C. A joining portion (connecting area) having a predetermined width in the Y direction is formed at the boundary between the first and second shot areas S1 and S2. At this time, the images of the opening portions to be exposed together with the circuit pattern image 16PB are exposed on the alignment mark images 21PA and 22PA on the first shot area S1, causing rectangular areas surrounding the alignment mark images 21PA and 22PA to be deleted areas 27A and 28A. There are not formed latent images of alignment marks or circuit pattern images in the deleted areas 27A and 28A. Further, new alignment mark images 21PB and 22PB are exposed inside the upper side of the circuit pattern image 16PB.

Figure 1D:
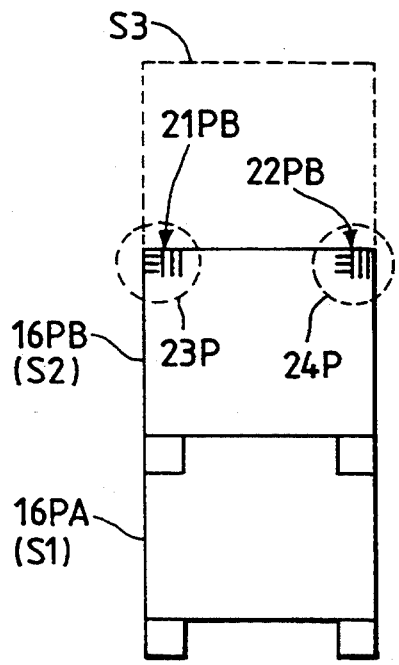

Then, after changing the reticle again with a reticle for exposing next as required, a third shot area S3 on the wafer 10 is shifted in the Y direction and positioned in the exposure field of the projection optical system 9 in FIG. 2, as shown in FIG. 1D. In this condition, the detecting lights are emitted from the respective alignment devices 25 and 26 in FIG. 2 to the detection areas 23P and 24P on the wafer 10 to detect the relative positional relationship between alignment mark images 21PB and 22PB consisting of the latent image patterns and the opening portions of the reticle for the next exposure. The information of the relative positional relationship is supplied to the controller 14 of FIG. 2. The controller 14 drives the wafer stage 11 and/or the reticle stage (not shown) to correct the relative positional relationship between the reticle for the next exposure and the wafer 10 such that the positional deviation between the circuit pattern image 16PB and an image of a circuit pattern of the reticle for the next exposure.

Figure 1E:
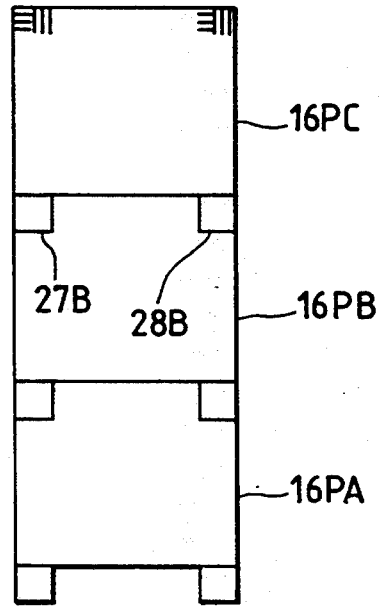

Thereafter, a circuit pattern image 16PC of the reticle is exposed on the third shot area S3, as shown in FIG. 1E. At this time, the opening portions to be exposed together with the circuit pattern image 16PC is also exposed on the alignment mark images 21PB and 22PB of the second shot area S2 to cause rectangular areas surrounding those images 21PB and 22PB to be deleted areas 27B and 28B.

Thus, the three circuit pattern images 16PA, 16PB and 16PC are formed to be a chip pattern image having an elongated large area in the Y direction as shown in FIG. 1E, by exposing the pattern of a reticle or the pattern of a plurality of reticles on the wafer successively and linearly in the Y direction. At this time, when the circuit pattern is exposed, e.g., on the second shot area S2, the alignment mark images of the latent image on the first shot area S1 are detected thereby to correct the positional relationship between the circuit pattern image exposed on the first shot area S1 and the circuit pattern image for the next exposure. Therefore, the overlapping accuracy at the joining portion between each shot area is enhanced.

Further, as shown in FIG. 1E, after all exposures are completed, all the alignment mark images of the first and second shot areas S1 and S2 are deleted. Accordingly, after subjecting the chip pattern image of FIG. 1E to development, etc., and when a large chip pattern image is exposed again on the chip pattern image of FIG. 1E by the joining method, alignment mark images can be again exposed on those deleted areas (27B, 28B or the like) to correct the relative positional relationship. Thereby, the exposure area on the wafer 10 can be effectively used, contributing to reduction of extra areas in the chip pattern.

Another embodiment of the present invention will be described hereinafter with reference to FIGS. 4, 5A to 5G, 6A to 6B and 7A to 7B. In this embodiment, circuit pattern images are joined two-dimensionally in the X and Y directions to expose a chip pattern image having a large area on a wafer.

Figure 4:
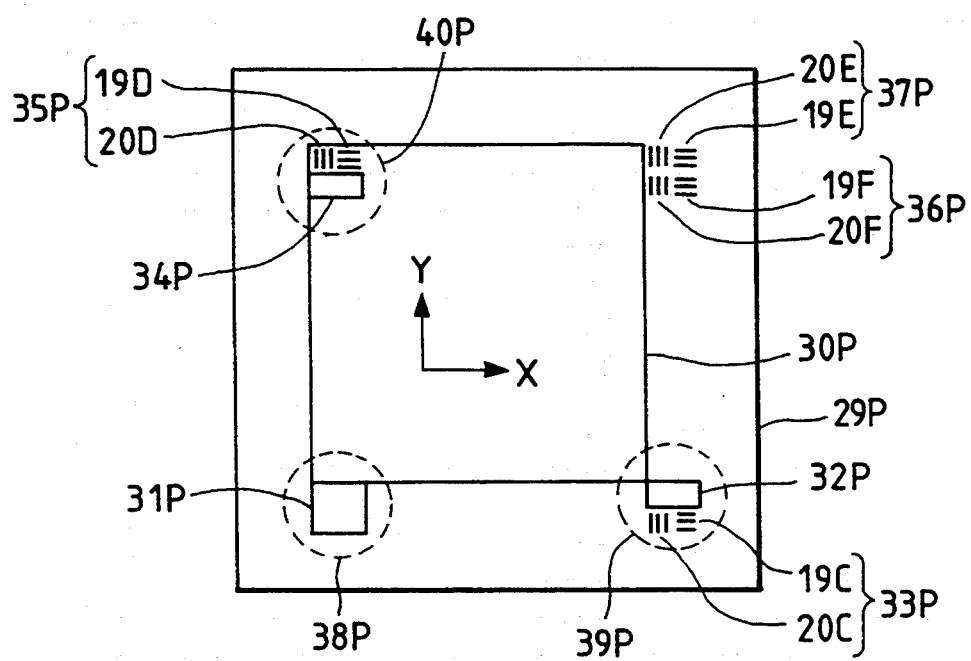
FIG. 4 is a plan view showing a projected image on a wafer from a reticle according to a second embodiment of the invention.

In FIG. 4 showing a reticle image 29P formed by projecting a reticle 29 (not shown) of the embodiment to the wafer, a rectangular circuit pattern image 30P is projected to an area corresponding to the pattern formed area of the reticle 29. Also, two opening portion images 31P and 32P are projected outside one of sides of the circuit pattern image 30P parallel to the X direction. The right opening portion image 32P is short in the Y direction. Outside the opening portion image 32P is projected an alignment mark image 33P consisting of a grating-like mark image 19C arranged in the Y direction at a constant pitch and a grating-like mark image 20C arranged in the X direction at a constant pitch.

Two alignment mark images 35P and 37P are projected inside the other one of sides of the circuit pattern image 30P parallel to the X direction, and respectively have grating-like mark images 19D and 19E arranged in the Y direction at a constant pitch and grating-like mark images 20D and 20E arranged in the X direction at a constant pitch. Also, an opening portion image 34P with a narrow width in the Y direction is projected inside the alignment mark image 35P while inside the alignment mark image 37P, there is projected an alignment mark image 36P having a mark image 19F identical with the mark image 19E and a mark image 20F identical with the mark image 20E.

In this embodiment, three identical alignment devices with the alignment devices 25 and 26 of FIG. 2 are disposed. When the reticle image 29P of FIG. 4 is positioned in the center of the exposure field of the projecting optical system, a detecting light from the first alignment device is illuminated to a detection area 38P surrounding the first opening portion image 31P, a detecting light from the second alignment device is illuminated to a detection area 39P surrounding the second opening portion image 32P, and a detecting light from the third alignment device is illuminated to a detection area 40P surrounding the third opening portion image 34P. In this embodiment, the alignment devices detect the relative positional relationship between the alignment mark images of latent images formed in the two detection areas selected among the three detection areas 38P to 40P and corresponding edges of the opening portions of the reticle.

Next, it will be described an example of an operation for exposing a chip pattern with a large area by joining an image of a pattern of a reticle or images of patterns of a plurality of reticles two-dimensionally and exposing them on a wafer.

FIGS. 5A to 5G show a process of joining and exposing shot areas. First, as shown in FIG. 5A, a circuit pattern image 30PA of the reticle image in FIG. 4 is exposed on a first shot area S1 of the wafer. At this time, opening portion images 31PA, 32PA and 34PA, and alignment mark images 33PA, 35PA, 36PA and 37PA are simultaneously exposed. Then, after changing the reticle with a reticle for the next exposure as required, a second shot area S2 on the wafer is shifted in the Y direction and positioned in the exposure field of the projection optical system, as shown in FIG. 5B. This shift is performed based on the coordinate arrangement of each shot area under the design as conventional.

In this condition, two detection areas 38P and 39P located at lower portions in the exposure field of the projection optical system are subjected to detecting lights from corresponding alignment devices to detect the relative positional relationship between the alignment marks 35PA and 37PA of the latent image patterns and opening portions (corresponding to the opening portions 17 and 18 in FIG. 2) of a reticle for the next exposure. The information of the relative positional relationship is supplied to a controller (corresponding to the controller 14 of FIG. 2). The controller 14 calculates the amount of the positional deviation between the circuit pattern image 30PA exposed on the first shot area S1 and a circuit pattern image of the reticle for the next exposure, and drives a wafer stage and/or a reticle stage to correct the relative positional relationship between the reticle for the next exposure and the wafer such that the amount of the positional deviation is minimized.

Thereafter, a circuit pattern image 30PB of the reticle is exposed on the second shot area S2, as shown in FIG. 5C. At this time, there is formed a joining portion (connecting area) having a predetermined width in the Y direction at the boundary of the first and second shot areas. The opening portion images to be exposed together with the circuit pattern image 30 are exposed so as to overlap with the alignment mark images 35PA and 37PA having been formed on the first shot area S1, causing rectangular areas surrounding those images 35PA and 37PA to be deleted areas 41A and 42A. Also, new alignment mark images 36PB and 37PB are exposed outside the upper right portion of the circuit pattern image 30PB, and an alignment mark image 33PB is exposed so as to overlap with the alignment mark image 36PA having been formed on the first shot area S1.

Figure 6A:
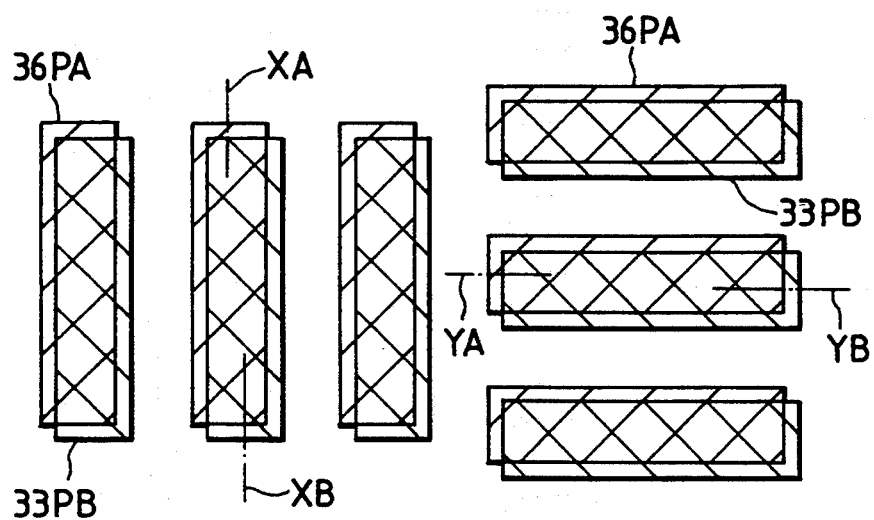
FIG. 6A is an enlarged plan view showing overlapped two alignment marks.
Figure 6B:
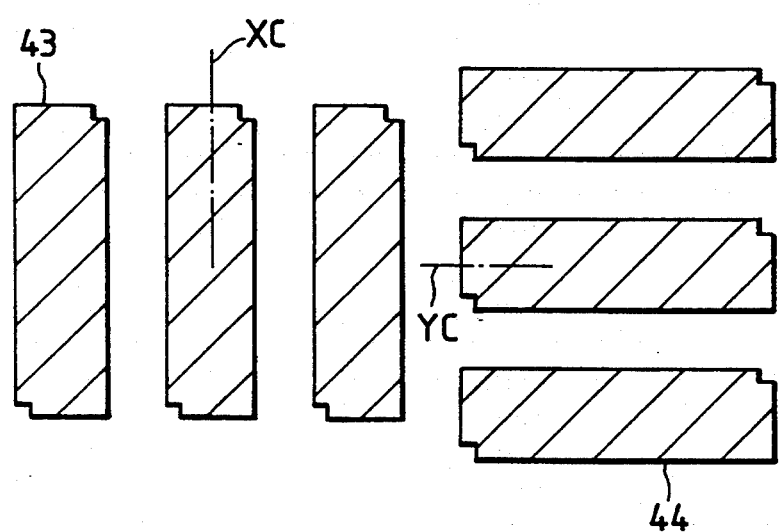
FIG. 6B is an enlarged plan view showing a composite latent image pattern of the overlapped two alignment marks in FIG. 6A.

FIG. 6A shows the alignment mark images 36PA and 33PB consisting of the latent images exposed so as to overlap each other and these images are composed to be composite latent image patterns 43 and 44, as shown in FIG. 6B. The composite latent image pattern 43 has a predetermined pitch in the X direction while the composite latent image pattern 44 has a predetermined pitch in the Y direction. Letting the coordinates of the center of the alignment mark images 36PA and 33PB in the X direction be XA and XB, the coordinate of the center of the composite latent image pattern 43 in the X direction is (XA+XB)/2. Also, letting the coordinates of the center of the alignment mark images 36PA and 33PB in the Y direction be YA and YB, the coordinate of the center of the composite latent image pattern 44 in the Y direction is (YA+YB)/2.

The position of the composite latent image patterns 43 and 44 is the mean position between the position of the alignment mark image 36PA exposed on the first shot area S1 and the position of the alignment mark image 33PB exposed on the second shot area S2. Accordingly, as will be described later, when an alignment device detects the relative positional relationship between the composite latent image pattern of the alignment mark images 36PA and 33PB and the corresponding edge of the opening portion of the reticle, it is possible to detect the mean position between the position of the circuit pattern image exposed on the first shot area S1 and the circuit pattern image exposed on the second shot area S2.

Then, after changing the reticle with a reticle for the next exposure as required, the wafer is shifted in the X and Y directions to position a third shot area S3 adjacent to the right side of the first shot area S1 in the exposure field of the projection optical system, as shown in FIG. 5D.

In this condition, detecting lights are emitted to the left detection areas 38P and 40P in the exposure field of the projection optical system from the respectively corresponding alignment devices. Then, the relative positional relationship between the alignment mark image 33PA of the latent image pattern in the detection area 38P and the opening portion of the reticle for the next exposure is detected. Simultaneously, the relative positional relationship between the composite latent image pattern of the alignment mark image 36PA and 33PB in the detection are 40P and the corresponding opening portion of the reticle is detected. The amount of the positional deviation between the exposed circuit pattern images 30PA and 30PB of the shot areas S1 and S2 and the circuit pattern image of the reticle for the next exposure is calculated from those relative positional relationships. The wafer stage and/or the reticle stage are driven to correct the relative positional relationship between the reticle for the next exposure and the wafer such that the amount of the positional deviation is minimized.

Thereafter, as shown in FIG. 5E, a circuit pattern image 30PC of the reticle is exposed on the third shot area. There is formed a joining portion having a predetermined width in the X direction at the boundary of the first and third shot areas S1 and S3. At this time, the opening portions to be exposed together with the circuit pattern image 30PC are exposed so as to overlap with the exposed alignment mark images 33PA and 36PA, 33PB, causing the rectangular areas surrounding them to be deleted areas 41B and 41C. Also, new alignment mark images 36PC and 37PC are exposed outside the upper right portion of the circuit pattern image 30PC.

Then, after changing the reticle with a reticle for the next exposure as required, as shown in FIG. 5F, the wafer is shifted in the Y direction to position in the exposure field of the projection optical system a fourth shot area S4 adjacent to the right side of the second shot area S2 and the upper side of the third shot area S3.

In this condition, detecting lights are emitted to the two detection areas 39P and 40P in the diagonal direction in the exposure field of the projection optical system from the corresponding alignment devices. Then, the relative positional relationship between the alignment mark image 37PC of the latent image pattern in the detection area 39P and the opening portion of the reticle for the next exposure is detected. Simultaneously, the relative relationship between the alignment mark image 36PB of the latent image pattern in the detection area 40 and the corresponding opening portion of the reticle is detected. From these relative positional relationships, the amount of the positional deviation between the exposed circuit pattern images 30PB and 30PC of the shot areas S2 and S3 and the circuit pattern image of the reticle for the next exposure is calculated. Thereafter, the wafer stage and/or the reticle stage are driven to correct the relative positional relationship between the reticle for the next exposure and the wafer such that the amount of the positional deviation is minimized.

Then, the circuit pattern image 30PD of the reticle is exposed on the fourth shot area S4, as shown in FIG. 5G. There is formed a joining portions having respective predetermined widths at the boundaries between the shot areas S2, S3 and the shot area S4. At this time, the opening portions to be exposed together with the circuit pattern image 30PD are exposed so as to overlap with the exposed alignment mark images 36PB and 37PC, causing rectangular areas surrounding those images 36PB and 37PC to be deleted areas 41D and 42D.

In this embodiment, the pattern image of a reticle or the pattern images of a plurality of reticles are joined and exposed on the wafer successively in the X and Y directions, so that the chip pattern image having a large area consisting of the four circuit pattern images 30PA to 30PD is exposed, as shown in FIG. 5G. In this case, also, when exposing the circuit pattern image on and after the second shot area S2, the alignment mark images of the latent images exposed on the adjacent shot areas are detected to correct the positional relationships between the exposed circuit pattern images and the circuit pattern image for the next exposure. Therefore, the overlapping accuracy at the joining portion between each shot area can be enhanced.

Further, after all the exposures have been completed, all the alignment marks used for alignment have been deleted, as shown in FIG. 5G. Therefore, after subjecting the chip pattern image of FIG. 5G to development or the like, and when exposing a chip pattern having a large area on it by the joining method, alignment mark images can be again exposed on those deleted areas to correct the relative positional relationship.

Furthermore, when the exposure method shown in FIGS. 5A to 5G is generalized, it is possible to expose a large chip pattern easily on shot areas arranged by N lines × M rows (N, M are integers of two or more) in the joining system with high overlapping accuracy.

Figure 7A:
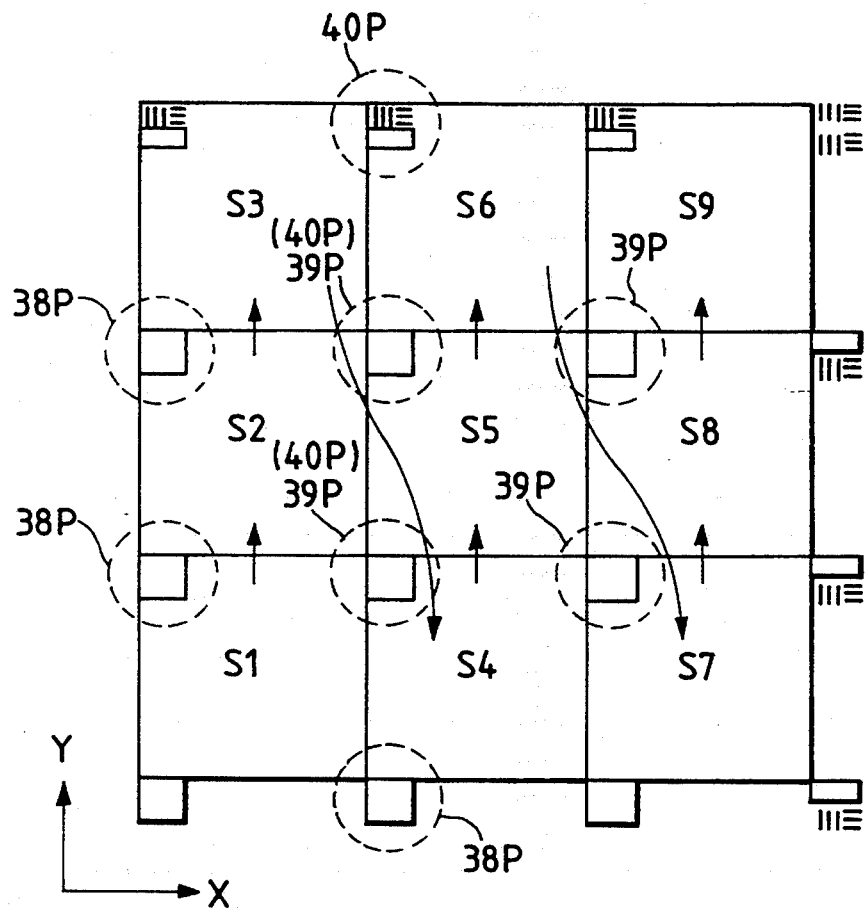
FIG. 7A is an explanatory diagram showing a process of performing exposure on nine shot areas of 3 lines×3 rows in a joining method.

FIG. 7A shows shot areas S1 to S9 arranged by 3 lines × 3 rows. When these nine shot areas S1 to S9 are exposed by the joining method, respective circuit patterns of reticles are first exposed successively on the shot areas S1 to S3 of the first row in the Y direction. At this time, alignment is performed by detecting the position of the alignment mark images of the latent image patterns in the two detection areas 38P and 39P located on the upper side within the exposure field of the projecting optical system.

Next, in exposures for the second row, the fourth shot area S4 adjacent to the right side of the first shot area S1 is first exposed, and then the shot areas S5 and S6 in the Y direction are exposed successively. At this time, when exposing the fourth shot area S4, alignment is performed by detecting the positions of the alignment mark images of the latent image patterns in the two detection areas 38P and 40P located on the left side within the exposure field of the projecting optical system. Also, when exposing the fifth and sixth shot areas S5 and S6, alignment is performed by detecting the positions of the alignment mark images of the latent image patterns within the two detection areas 39P and 40P in the diagonal direction within the exposure field of the projection optical system. Similarly, when performing exposures for the third row, the seventh shot area S7 adjacent to the right side of the fourth shot area S4 is first exposed, and then the shot areas S8 and S9 in the Y direction are successively exposed.

Figure 7B:
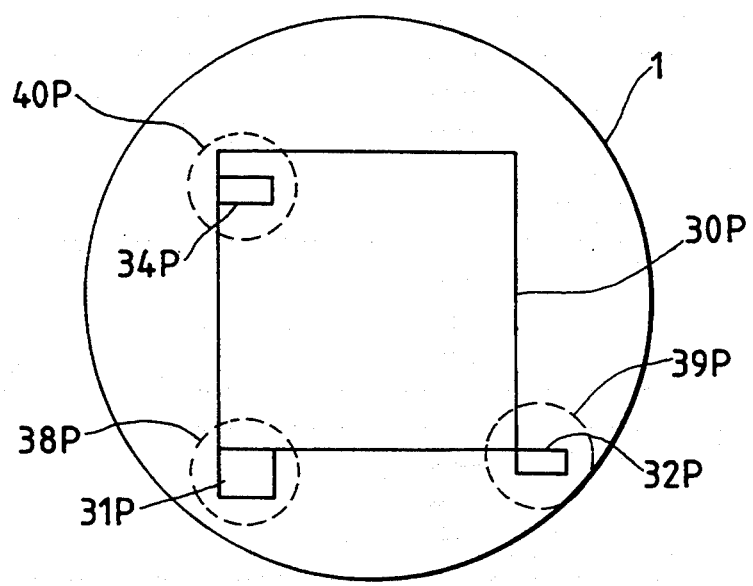
FIG. 7B is a plan view showing detection areas within an exposure field of a projection optical system.
Figure 8A:
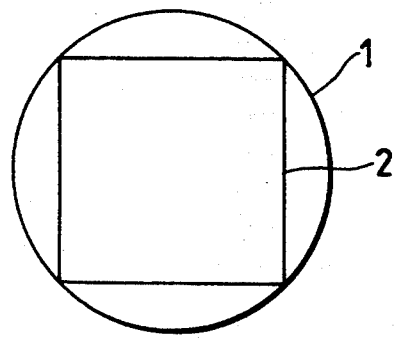
FIG. 8A is a plan view showing an exposure field of a projection optical system.
Figure 8B:
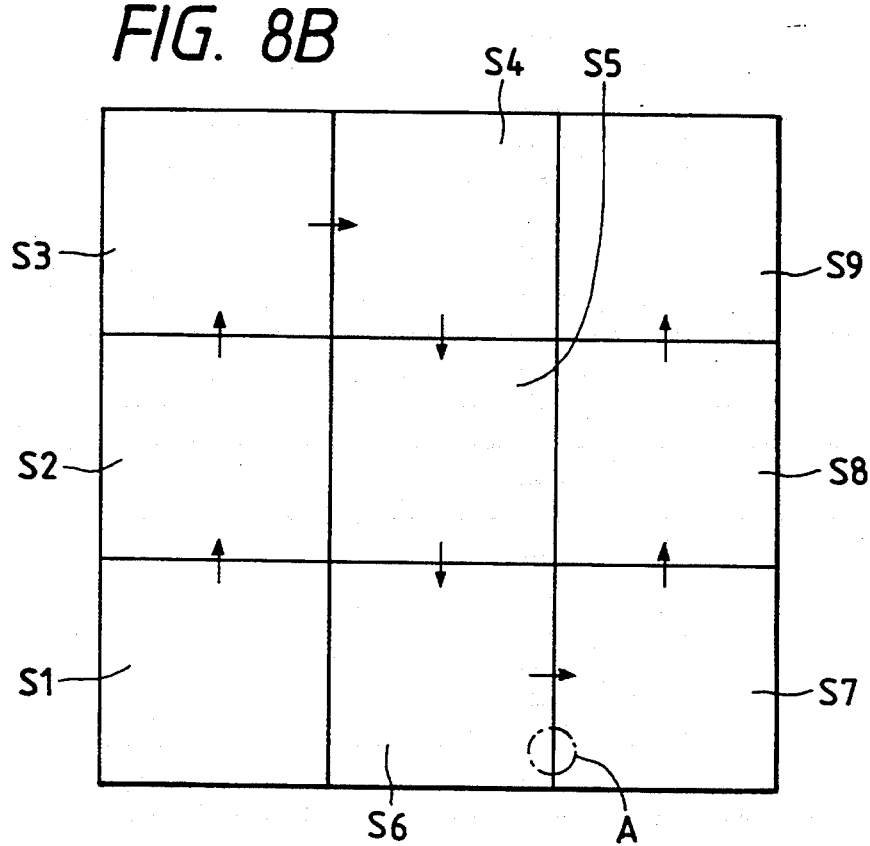
FIG. 8B is an explanatory diagram showing a process of performing exposures on nine shot areas in a conventional joining method.
Figure 8C:
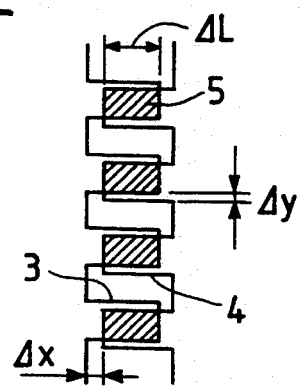
FIG. 8C is an explanatory diagram showing overlapping errors at a joining portion between shot areas.

In order to summarize those above-described, it is assumed that the circuit pattern image 30P is a circuit pattern image to be exposed in the center within the maximum exposure field 1 of the projection optical system, as shown in FIG. 7B. At this time, the alignment mark images (latent image patterns) to be used at the exposures on the shot areas in the first row are positioned within the opening portion images 31P and 32P in the two respective detection areas 38P and 39P on the lower side of the circuit pattern image 30P. And, the alignment mark images to be used at the exposures on the first shot area in the n-th row ($2 \leq n \leq N$) are positioned within the opening portion images 31P and 34P in the two detection areas 38P and 40P on the left side of the circuit pattern image 30P. Further, the alignment mark images to be used at the exposures on and after the second shot area in the n-th row are positioned within the respective opening portion images 32P and 34P in the two detection areas 39P and 40P in the diagonal direction of the circuit pattern image 30P.

Thus, the positions of the alignment mark images of the latent image patterns in the two detection areas selected from the three detection areas 38P to 40P are detected in accordance with the arrangements of the shot areas, so that it is possible to expose the effective alignment mark images as well as to delete the used alignment mark images efficiently.

Although the alignment mark images of the latent image patterns on the wafer are detected via the projection optical system and the reticle in this embodiment, the alignment system is not limited thereto, and the present invention may be applicable in the TTL (through-the-lens) system, wherein alignment mark images are not detected via a reticle. Also, the mark image of the alignment mark image for the X direction has a different pattern from that of the alignment mark image for the Y direction, but an inclined mark image relative to the X and Y directions may be used to detect the positional deviation in the X and Y directions.

Further, although two portions in the exposure field of the projection on optical system are used as the detection areas for alignment in the above-described embodiment, one portion in the exposure field may be used as a detection area for alignment. When one alignment mark image is used for alignment, it is detected only the offset to the X and Y directions or the amount of the positional deviation in one coordinate direction. However, the overlapping accuracy at the joining portion between each shot area is improved, as compared with the conventional method wherein the positional deviation is not monitored. When performing exposure by the joining method, there occurs a problem of the differences of distortions at the joining portions between each shot area. Then, it is naturally possible to impart offsets to alignment positions such that the distortion conditions are joined optimally at the time of alignment.

In connection with the above, e.g., when performing exposures on the shot areas of 3 lines × 3 rows in FIGS. 7A and 7B by the joining method, it is preferable to align each reticle with the wafer in consideration of reduction of average distortion of the whole chip pattern image as well as the positional relationships between the exposed circuit pattern images of the adjacent shot areas. For example, if exposures are performed so as to cause positioning errors (joining errors) at the joining portions between the whole adjacent shot areas to approach to zero, it will be difficult to keep the joining errors, e.g., in the last shot area within predetermined allowable values or less. Then, taking account of the joining errors of the preceding shot areas, the exposure is performed for the last shot so as to cause joining errors to occur within the range of the allowable values of the joining errors intentionally. Thereby, all the joining errors at the whole joining portions are kept within the allowable values.

Further, in the above-described embodiment, the alignment mark images are overlapped to form the composite latent image pattern, as shown in FIGS. 6A and 6B. The method of obtaining the mean effect by the composition of these two marks is not limited to the use of the latent image patterns, and may be also applicable to the usual alignment technique so as to improve optical precision.

Further, although the step-and-repeat type projection optical apparatus is used in the above embodiments, the present invention may be applied to a scan type optical apparatus wherein the pattern of a reticle is exposed on a wafer while the reticle and the wafer are scanned relatively. In that case, the arrangement of alignment marks needs to be changed.

In the above embodiment, the reticle is changed for each exposure. But, a plurality of patterns may be formed on a reticle and a variable field stop (a reticle blind) may be disposed in a plane corresponding to the pattern surface of the reticle in the illuminating optical system 6 for illuminating the exposure light IL to the reticle. In that case, the reticle blind is driven by the controller 14 for each pattern to be transferred to the wafer in accordance with the position and the size of each pattern on the wafer. Also, a plurality of mark images for positioning e.g., as shown in FIG. 3 or FIG. 4 are formed on each of the plurality of patterns on the reticle. If all the patterns on the reticle are not positioned within the exposure field of the projection optical system 9, the reticle may be moved in a plane perpendicular to the optical axis of the projection optical system 9 so that the pattern to be next transferred is positioned in the exposure field, which is also executed by driving the reticle blind. It is to be noted that the above-mentioned serial exposure operations may be conducted by using two methods of the exchange of reticles and the driving of a reticle blind jointly.

Furthermore, the positional deviation is detected from the relative positional relationship between the latent image pattern formed on the wafer and the opening portion on the reticle in the above embodiments. However, only the latent image pattern may be detected by e.g., alignment devices to obtain coordinate values of that in the system of rectangular coordinates X and Y. In that case, after the wafer stage 11 is shifted in accordance with the coordinate values, the pattern image for the next exposure is exposed so as to be joined with the pattern image exposed on the wafer.

The present invention is not limited to the above-described preferred embodiments, and it should be interpreted to be within the protective scope of the present invention even if the present invention is changed and modified into various forms as long as these changes and modifications are not depart from the spirit of the invention.

According to the present invention, when exposing patterns formed on a reticle or respective patterns formed on a plurality of masks successively on a photosensitive substrate by joining them, the position of at least one mark image for positioning of a latent image projected by a previous exposure is detected for positional adjustment. Therefore, it is possible to improve overlapping accuracy at joining portions between adjacent shot areas, which can improve yield rate of the finally obtained large chip.

Also, when exposing a pattern of a first mask or a second mask on a second shot area, a double exposure is performed on the mark image on a first shot area to delete the mark image on the first shot area. Then, a mark image can be again projected on the deleted area, contributing to effective use of the exposure area on the photosensitive substrate.

Further, at least three marks for positioning are formed on each of masks as objects for exposure. When performing exposure on a third shot area on the photosensitive substrate after the exposure of the first shot area, at least one mark image selected from the three mark images exposed on a shot area or each of two shot areas adjacent to the third shot area is detected. Then, it is possible to carry out the positional adjustments of the photosensitive substrate and the mask having the pattern image to be exposed on the third shot area based on the result of the detection. Accordingly, a plurality of patterns can be exposed by the joining method on the photosensitive substrate two-dimensionally with high overlapping accuracy.

Furthermore, it is possible to utilize a composite pattern of overlapped mark images of latent image patterns for alignment, so that overlapping accuracy at the joining portions between the adjacent shot areas can be enhanced owing to the mean effect.

What is claimed is:

1. A method of exposing a pattern formed on a mask repeatedly or respective pattern formed on a plurality of masks successively on a photosensitive substrate so as to join adjacent pattern images to each other to expose a larger pattern than a pattern of said mask or each of said plurality of masks, comprising the steps of:

exposing a pattern and at least one alignment mark formed on a first mask on a first shot area of said photosensitive substrate;

detecting an image of said alignment mark exposed on said photosensitive substrate when exposing a pattern of said first mask or a pattern of a second mask different from said first mask on a second shot area adjacent to said first shot area so as to be joined with said exposed pattern image of said first mask; and adjusting respective positions of said photosensitive substrate and said first or second mask having a pattern to be exposed on said second shot area on the basis of the result of said detection.

2. An exposure method according to claim 1, further comprising the step of performing a double exposure on said alignment mark image on said photosensitive substrate so as to delete said alignment mark image when exposing said pattern of said first or second mask on said second shot area.

3. An exposure method according to claim 1, forming at least three alignment marks on each of said masks as objects for exposure;

when performing an exposure on a third shot area on said photosensitive substrate after the exposure of said first shot area, detecting at least one alignment mark image selected from said three alignment mark images exposed on a shot area or each of two shot areas adjacent to said third shot area; and adjusting respective positions of said photosensitive substrate and said first or second mask having a pattern to be exposed on said third shot area based on the result of the detection.

4. A method of exposing a plurality of original patterns successively on a photosensitive substrate so as to join adjacent original pattern images to each other, comprising the steps of:

exposing a first original pattern having at least one alignment mark on said photosensitive substrate;

detecting a latent image of said alignment mark prior to exposing a second original pattern on said photosensitive substrate so as to be joined with said exposed first original pattern image; and adjusting respective positions of said second original pattern and said photosensitive substrate on the basis of said detection.

5. An exposure method according to claim 4, further comprising the step of illuminating light with a wave band for exposing said photosensitive substrate to an area of said photosensitive substrate including said latent image of said alignment mark after said adjusting step.

* * * * *